United States Patent [19]

Yang

[11] Patent Number: 5,306,657

[45] Date of Patent: Apr. 26, 1994

[54] PROCESS FOR FORMING AN FET READ ONLY MEMORY DEVICE

[75] Inventor: Ming-Tzong Yang, Hsin Chu, Taiwan

[73] Assignee: United Microelectronics Corporation, Hsinchu, Taiwan

[21] Appl. No.: 35,182

[22] Filed: Mar. 22, 1993

[51] Int. Cl.$^5$ ............................................. H01L 21/70
[52] U.S. Cl. ........................................ 437/52; 437/29; 437/45; 437/48
[58] Field of Search .......................... 437/29, 45, 48, 52

[56] References Cited

U.S. PATENT DOCUMENTS

| | | | |
|---|---|---|---|
| 4,208,780 | 6/1980 | Richman | 437/48 |
| 4,818,716 | 4/1989 | Okuyama et al. | 437/52 |
| 4,874,715 | 10/1989 | Paterson | 437/52 |
| 5,091,328 | 2/1992 | Miller | 437/45 |
| 5,200,355 | 4/1993 | Choi et al. | 437/48 |

Primary Examiner—Tom Thomas
Attorney, Agent, or Firm—George O. Saile

[57] ABSTRACT

A method of producing a ROM device wherein parallel spaced bit line regions are formed in a semiconductor substrate, blanket layers of (1) polysilicon, (2) etch stop material, and (3) polysilicon, are deposited, the layers etched to form orthogonal parallel word lines on the surface of the substrate, a thick insulating layer deposited over the word lines, a resist layer deposited, exposed and developed to define a desired code implant pattern, the exposed areas of the thick layer removed, and the underlie upper polysilicon layer of the bit line removed, and ion implanted into the substrate to form a code implant.

16 Claims, 4 Drawing Sheets

PROCESS FOR FORMING AN FET READ ONLY MEMORY DEVICE

BACKGROUND OF THE INVENTION (1) Field of the Invention

This invention relates to Read Only Memory (ROM) manufacturing techniques, more particularly to a method of producing high density ROM's that embody a novel technique to introduce code implantations.

(2) Description of the Prior Art

Non-volatile semiconductor ROM devices are advantageous in that the information stored therein is not lost when the power supply is lost or removed. In a PET ROM, the data is written into the ROM as part of the manufacturing process. The writing process is called coding. In general a ROM device is an array of FET's arranged in columns and rows supported on a semiconductor substrate. A plurality of closely spaced line regions are provided in the substrate with a dopant of a type opposite the background conductivity dopant of the substrate. A plurality of parallel, closely spaced conductive lines are provided on the surface of the substrate that extend in a direction that is orthogonal to the line regions in the substrate. At the intersection of each surface conductive line and two adjacent line regions, an FET is formed. The adjacent line regions constitute a source and drain region, with the surface conductive line, overlying a gate oxide layer, forming the gate electrode. Each FET can be addressed separately by applying the proper voltages to the line regions, i.e. bit lines, and the surface conductive line, i.e. the word line. In the coding operation, the areas under selected word lines, between the source and drain regions, is made permanently conductive, as by introducing dopant ions into the substrate. In a FET storage cell, a binary 0 or 1 is represented by the conductive state of the FET. Arbitrarily, a 0 will be assigned to an FET that conducts between its drain and source, and 1 will be assigned to a non-conducting FET. The procedure for integrating the cells is well known.

Referring now to FIG. 1, there is illustrated a prior art technique for coding a ROM. FIG. 1 is taken on a line parallel to the bit line regions and in between the regions, so none will appear in the figure. As shown, the coding procedure arbitrarily calls for forming conductive regions 14 for the normally-off ROM or non-conductive regions for the normally-on ROM, beneath word line 10, and no region beneath word line 12 in substrate 16. A photoresist layer 18 defines opening 20 over word line 10. Since the device geometry is of such a small scale, it is not possible to align openings 20 exactly over word lines 10. The resultant conductive regions 14 are not located exactly beneath the lines 10, and in some instances, due to ion migration, may meet, causing a defective reading.

What is desirable is a more precise procedure for forming the conductive for the normally-off ROM or the non-conductive regions for the normally-on ROM regions during the coding operation.

SUMMARY OF THE INVENTION

It is an object of this invention to provide a more precise process for coding an FET ROM.

Another object of the invention is to provide in a method of fabricating a ROM, an improved technique of coding the device using self alignment techniques.

Yet another object of the invention is to provide an improve ROM having a more precisely defined coded regions.

In accordance with the above objects there is provided a method of fabricating a ROM device wherein a plurality of closely spaced line regions of a first type dopant constituting bit lines are formed in a semiconductor substrate. Blanket layers of polysilicon, an etch stop layer, and a overlying layer of polysilicon on the substrate are formed. The resultant layers are subtractively etched to form orthogonally extending word lines on the substrate. A thick insulating layer is formed over the word lines. A resist layer is formed over this thick insulating layer. The layer is exposed and developed to define the desired code implant pattern over selected area of the word lines. The exposed portions of the upper polysilicon layer are etched down to the etch stop layer. First the dopant ions are introduced through the openings into the substrate to form code implant regions.

In addition, there is provided a ROM device which includes a plurality of closely spaced line regions of a first type impurity in a semiconductor substrate, a plurality of orthogonal closely spaced word lines on the substrate, a pattern of code implant regions of a first type impurity in the substrate selectively located between the bit lines and underlying portions of the word lines, the word lines having a lower layer of polysilicon. An intermediate etch stop layer, and an overlying upper layer of polysilicon, and wherein the word line portions over the code implant regions has only a lower polysilicon layer and an etch stop layer.

BRIEF DESCRIPTION OF THE DRAWINGS

The accompanying drawings, which are incorporated in and constitute a part of the specification, illustrate a preferred embodiment of the invention and serve to explain the principles of the invention.

DESCRIPTION OF THE PREFERRED EMBODIMENTS

Figure 1:
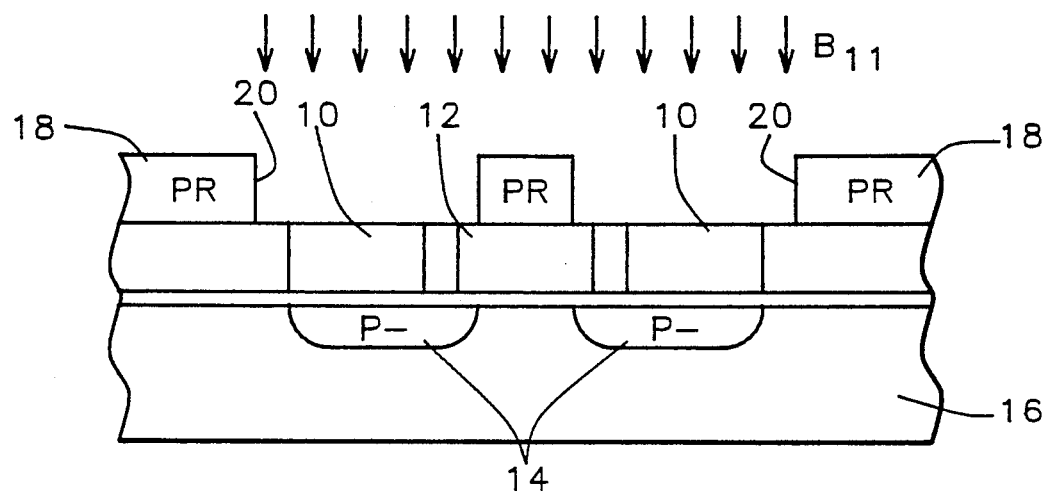
FIG. 1 is a cross sectional view of a ROM device that illustrates a typical fabrication technique of the Prior Art and indicates the problems associated with it.
Figure 2:
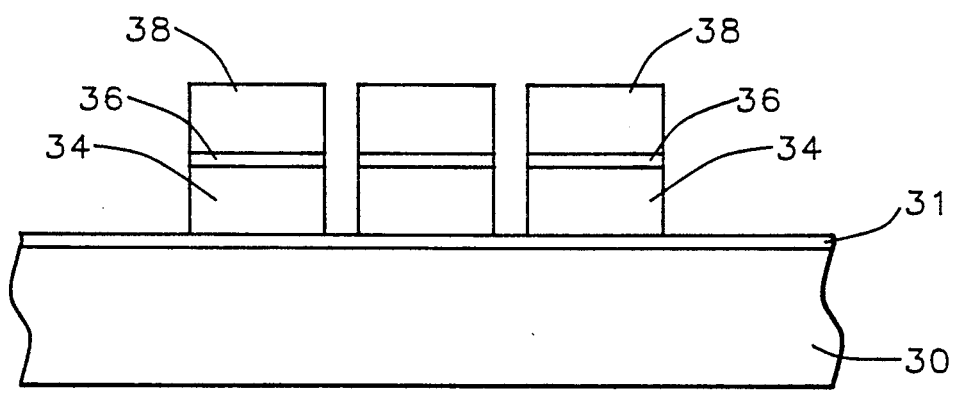
FIGS. 2 through 5 are a sequence of cross sectional views, in broken section and in greatly enlarged scale, that illustrates the fabrication process of the invention.
Figure 4:
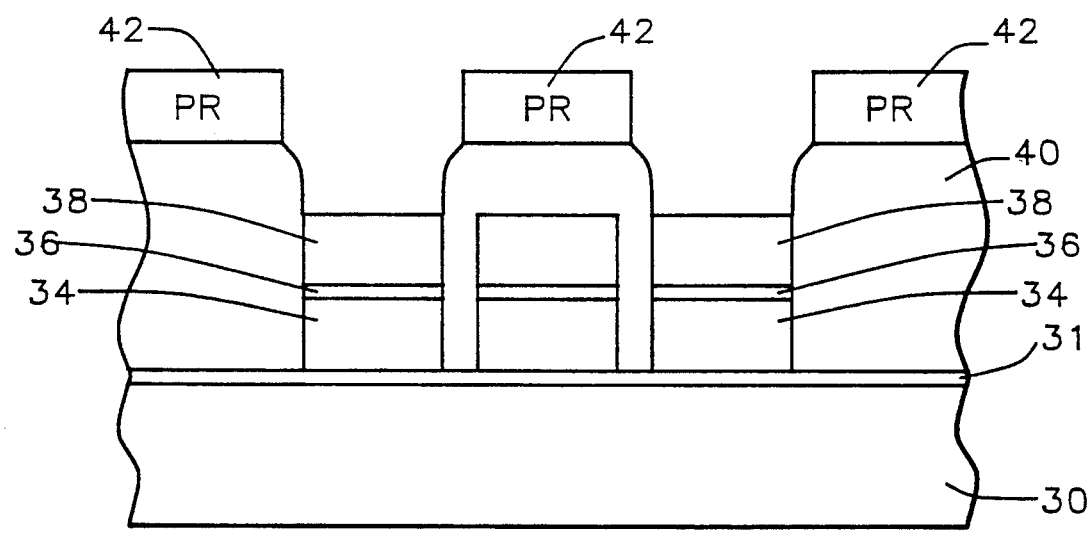
Figure 5:
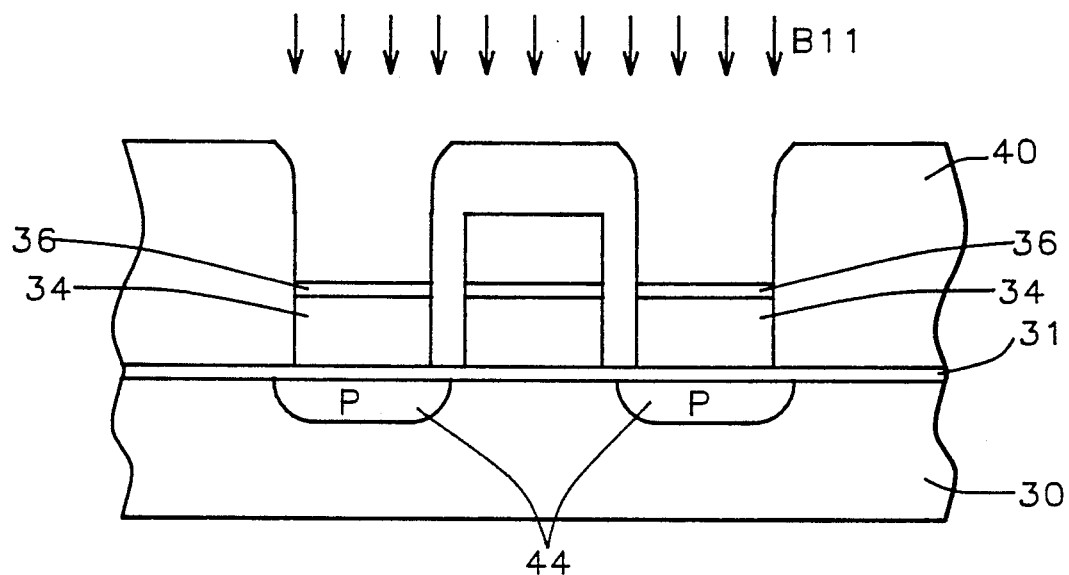
Figure 6:
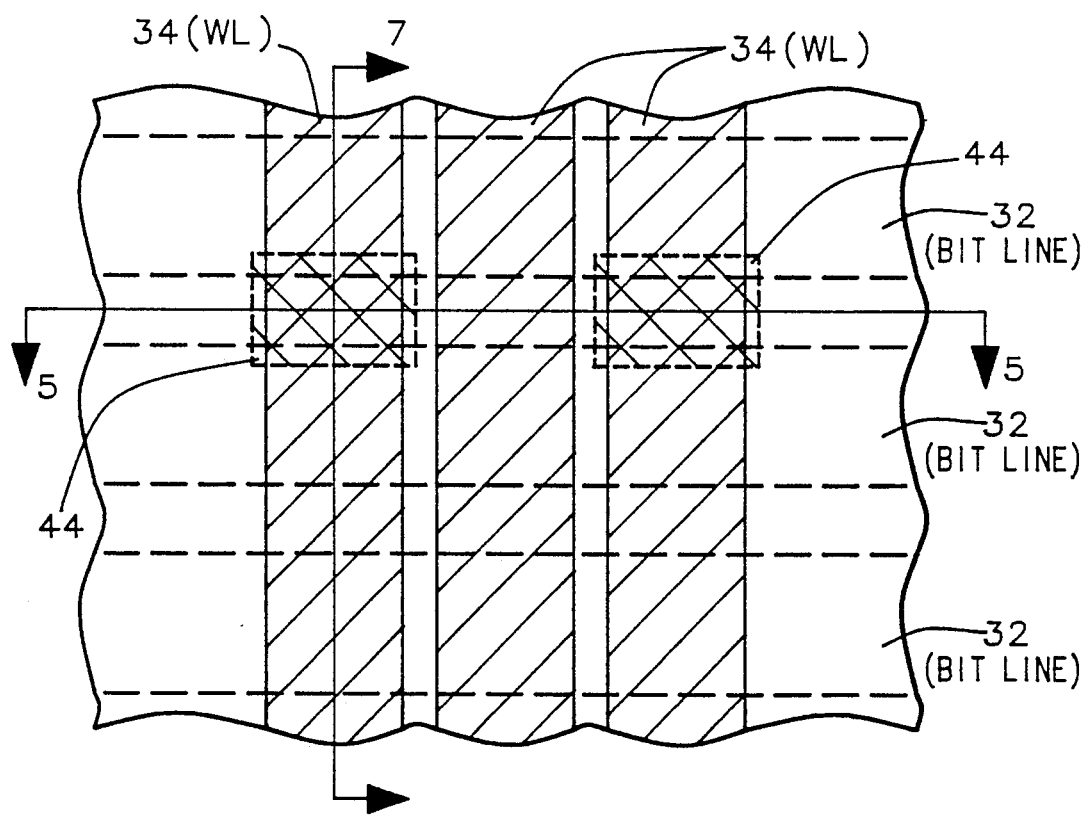
FIG. 6 is a top plan view of a device produced by the process of the invention.
Figure 7:
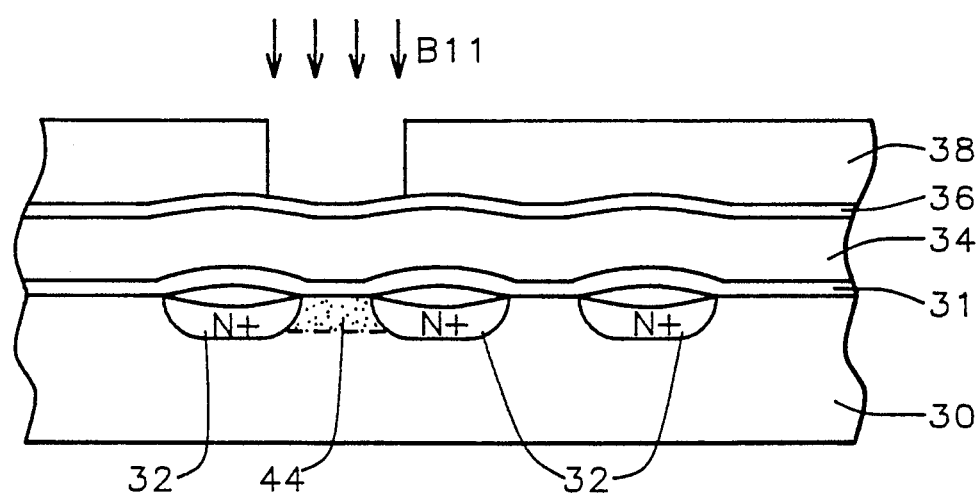
FIG. 7 is an elevational view taken on line 7—7 of FIG. 6.

Referring now to the drawings, more particularly to FIGS. 2 through 7. FIG. 2 illustrates a semiconductor substrate 30, formed typically of monocrystalline silicon having a crystal orientation of (100), and a suitable background dopant, typically P type of a Boron concentration of between about 5 E 14 to 5 E 17 ions/cm$^3$. Substrate 30 has a plurality of closely spaced conductive line regions formed of a dopant of a conductivity opposite to the background dopant, typically of a dopant, such as arsenic or phosphorus having a concentration in the range of about 5 E 17 to 5 E 21 ions/cm$^3$. These line regions, which constitute bit lines, are adjacent to the surface of substrate 30, and are formed by techniques well known in the art. These bit regions 32 do not appear in FIG. 2, because the cross section is taken parallel to the word line regions and between adjacent bit lines. However, lines 32 are illustrated in FIGS. 6 and 7.

A thin insulating layer 31 is provided on the surface of substrate 30 which serves as a gate silicon oxide layer. This layer is typically a thermal oxide layer with a thickness in the range of about 30 to 500 Angstroms, formed after the regions 32 have been formed. Subsequently a blanket layer 34 of polysilicon or polycide is deposited on layer 32. Layer 34 has a thickness, preferably in the range of between about 500 to 5000 Angstroms. It can be deposited by conventional low pressure chemical vapor deposition (LPCVD), plasma enhanced chemical vapor deposition (PECVD), or atmospheric pressure chemical vapor deposition (APCVD). If the layer 34 is polycide it can be deposited by LPCVD, PECVD, APCVD or sputtering.

Blanket layer 36 is deposited over 34. Layer 36 serves as an etch stop layer, at a later stage in the process. Layer 36 is formed of a material which will not significantly be affected when the overlying layer 38 is etched. Layer 36 can be formed of thermal silicon oxide, CVD silicon oxide, CVD silicon nitride, titanium, titanium nitride, titanium/tungsten, or the like having a thickness in the range of about 30 to 2000 Angstroms. An overlying blanket layer 38 of polysilicon or polycide is deposited over layer 36. Layer 38 is similar to layer 34, and can be deposited in the same manner. The composite layer consisting of layers 34, 36, and 38 is then anisotropically etched to form a plurality of parallel conductive lines that extend orthogonally to bit lines 32 in substrate 30. The conductive lines function as word lines in the completed ROM. The word lines can be etched by conventional techniques, such as masking and reactive ion etching or plasma polysilicon etching.

Figure 3:
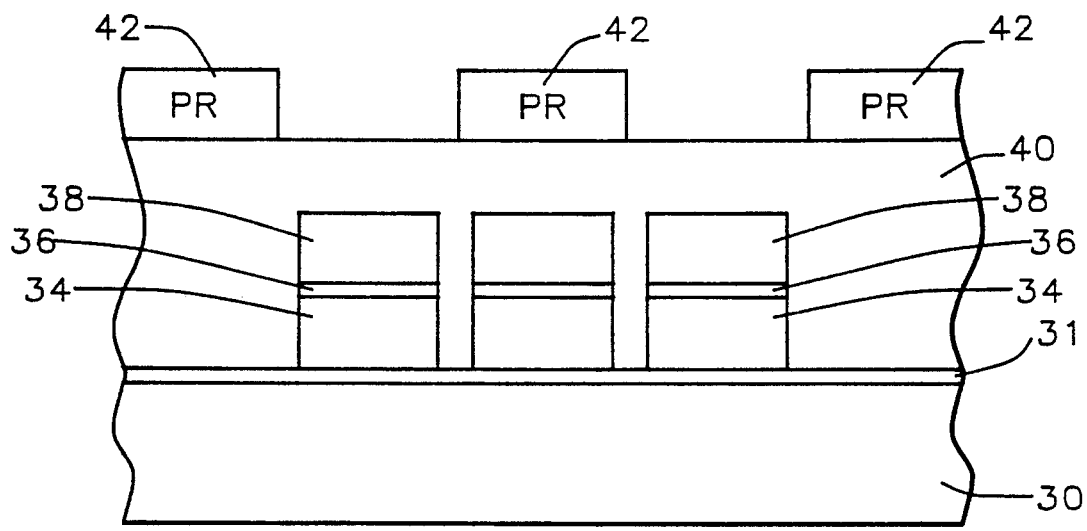

As shown in FIG. 3, a thick insulating layer 40 is deposited on the substrate 30 over the bit lines and planarized. Preferably layer 40 is borophosphosilicate glass (BPSG) with a thickness greater than the thicknesses of the word lines, typically with a thickness in the range of about 1000 to 12000 Angstroms. The layer 40 is planarized by thermal flowing techniques. Subsequently, a photoresist layer 42 is deposited over layer 40, and exposed and developed to define the desired code pattern. Note that the pattern illustrated in FIG. 3 has the objective of forming coded (conductive or non-conductive) regions in substrate 30 under the first and third bit lines, and none under the center line. Note also that perfect alignment of the openings in resist layer 42 over the bit lines is not necessary.

As shown in FIG. 4 the exposed areas of layer 40 are etched to expose the upper surfaces of the upper layers of layer 38. This is accomplished by reactive ion etching or wet silicon oxide etching with buffered (BOE) hydrofluoric acid.

As shown in FIG. 5, the exposed layer portions of layer 38 are removed thereby forming a code implant mask. The exposed portions of layer 38 are preferably removed by a plasma etching process. A code implant operation forms the code implant regions 44 that are positioned between bit lines 32, as more clearly illustrated in FIG. 6 and FIG. 7. The preferred process uses boron ions (B11) for the normally-on ROM, or phosphorus or Arsenic ions for the normally-off ROM.

Note that the code implant regions are defined by the openings left by removing portions of layer 38 and therefore are precisely aligned under the bit lines 34. FIG. 5 is a cross sectional view taken on line 5—5 of FIG. 6.

The code implant is activated by the thermal flow (cycle) of 800 to 1000 C. where this code implant is done after the polysilicon deposition. This process step from FIG. 4 to FIG. 5 can be done before or after the metal pattern (not shown) formation. The activation of code implant is a separate step of 400° to 550° C. for a time of about 10 to 60 minutes where heat is by a furnace equipment and 30 seconds to 10 minutes where heat is by rapid thermal annealing (RTA) and wherein aluminum is the metal pattern. This activation process would give only partial activation, that is between 10 to 30%. However, this partial activation is sufficient for the code implant to be readable particularly where as below 3+ times of boron is used as the dosage. Total dosage (after polysilicon deposition & before metal pattern formation) of boron implant is between about 2 E 17 to 5 E 18 (preferably 1 to 2 E 18) atoms/cm$^3$ at between about 100 to 300 KEV. Total dosage (after metal pattern formation) of boron implant is between about 5 E 17 to 5 E 19 (preferably 3 to 8 E 18) atoms/cm$^3$ at between about 100 to 500 KEV.

The device structure shown in FIG. 5 is thereafter covered with a suitable insulating layer and suitable metallurgy deposited to make electrical connections to the word and bit lines, as is well known in the art.

It is understood that suitable address circuits and bit sensing circuits can be provided on substrate 30 to interact with the word and bit lines of the ROM, as is well known in the art.

While the invention has been particularly shown and described with reference to the preferred embodiments thereof, it will be understood by those skilled in the art that various changes in form and detail may be made therein without departing from the spirit and scope of the invention.

What is claimed is:

1. A method of producing a Read Only Memory device having closely spaced elongated regions constituting bit lines in a semiconductor substrate and a plurality of orthogonal closely spaced surface conductive lines, constituting word lines and code implant regions comprising:

forming a plurality of closely spaced line regions of a first conductivity type, forming bit lines in a semiconductor substrate of a second conductivity type opposite to said first conductivity type;

forming a first insulating layer on said substrate for gate insulation;

forming a blanket layer of polysilicon over said first insulating layer;

forming a blanket etch stop layer over said polysilicon layer;

forming an overlying polysilicon layer over said etch stop layer;

selectively etching the polysilicon layer, the etch stop layer, and the overlying polysilicon layer to form orthogonally extending word lines over said bit lines;

forming a second insulating layer over said word lines of a thickness greater than the combined thickness of said polysilicon layer, said etch stop layer, and said overlying polysilicon layer;

exposing and developing a pattern in a resist layer to define a code implant pattern, said pattern defining openings over selected areas over said word lines;

etching the exposed areas of the second insulating layer to expose the overlying polysilicon layer of said word lines;

etching the exposed portions of the overlying polysilicon layer down to the etch stop layer;

ion implanting code implant dopants into said substrate through the openings in the second insulating layer and overlying polysilicon layer to form code implant regions between said bit lines wherein there is no lithography step required to form the code implant regions.

2. The method of claim 1 wherein polysilicon layer includes a metal silicide.

3. The method of claim 2 wherein said upper polysilicon layer includes a metal silicide.

4. The method of claim 3 wherein said metal silicide is tungsten silicide, which is formed by depositing tungsten silicide on the surface of the polysilicon layers.

5. The method of claim 1 wherein said first conductivity type is P type and said second conductivity type is N type.

6. The method of claim 1 wherein said first conductivity type is N+ type, said second conductivity type is P type and said code implant dopant is P type.

7. The method of claim 6 wherein said code implant dopant is done before metal patterning formation and has a total dosage of between about 2 E 17 and 5 E 18 atoms/cm$^3$.

8. The method of claim 7 wherein the activation of said code impant dopant is in a thermal cycle of between about 800 to 1000 C.

9. The method of claim 6 wherein said code implant is done after metal pattern formation and has a total dosage of between about 5 E 17 to 1 E 19 atoms/cm$^3$.

10. The method of claim 9 wherein said metal pattern is composed of aluminum and the activation of said code implant is by rapid thermal anneal at a temperature of between about 400 to 550 C. for between about 30 seconds and 10 minutes.

11. The method of claim 1 wherein said etch stop layer is a material selected from the group consisting of silicon oxide, silicon nitride titanium, titanium nitride and titanium/tungsten; and wherein the thickness of the etch stop layer is in the range of 30 to 500 Angstroms.

12. The method of claim 1 wherein the thickness of the polysilicon layer is in the range of 500 to 5000 Angstroms, and the thickness of the upper polysilicon layer is in the range of 500 to 8000 Angstroms.

13. The method of claim 1 wherein said word lines are formed in said polysilicon layer by masking and plasma etching.

14. The method of claim 7 wherein said code implant dopant is boron 11 and is implanted using at least 125 KEV.

15. The method of claim 7 wherein said code implant dopant is boron 11 and is implanted using at least 250 KEV.

16. The method of claim 10 wherein said code implant dopant is only partially activated to between about 10 to 30%.

* * * * *